United States Patent [19]

Sadoway et al.

[11] Patent Number: 4,882,199
[45] Date of Patent: Nov. 21, 1989

[54] METHOD OF FORMING A METAL COATING ON A SUBSTRATE

[75] Inventors: Donald R. Sadoway, Belmont, Mass.; Rana P. Singh, White Fish Bay, Wis.

[73] Assignee: Massachusetts Institute of Technology, Cambridge, Mass.

[21] Appl. No.: 108,166

[22] Filed: Oct. 13, 1987

Related U.S. Application Data

[63] Continuation-in-part of Ser. No. 897,116, Aug. 15, 1986, abandoned.

[51] Int. Cl.⁴ .............................................. C23C 2/04
[52] U.S. Cl. .................................... 427/53.1; 427/431
[58] Field of Search ................................ 427/431, 53.1

[56] References Cited

U.S. PATENT DOCUMENTS

| 2,873,214 | 2/1959 | Schmable | 427/431 |
| 2,873,216 | 2/1959 | Schmable | 427/431 |
| 4,624,871 | 11/1986 | Maximouich | 427/431 |
| 4,654,237 | 3/1987 | Savitsky | 427/431 |

OTHER PUBLICATIONS

*Molten Salts Handbook*, George J. Janz, Academic Press, 102–115, (Academic Press, New York, 1967).
"Dissolution of Metals in Fused Halides," E. A. Ukshe & N. G. Bukun, *Russian Chemical Reviews*, 30(2), 90–107 (1961).
"Miuxtures of Metals with Molten Salts" by M. A. Bredig, *Molten Salt Chemistry*, Edited by Milton Blander, 367–425 (Interscience Publishers, New York).
"High Temperature Equilibria in Metal", D. Cubicciotti, U.S. Atomic Energy Commission, 1947.
"Solutions of Metals in Molten Salts" D. Cubicciotti, *Journal of Chem. Education*, 27, 1960 (540–543).
Deposition Rechnologies for Films and Coatings by R. F. Bunshah et al., (Noyes Publication, New Jersey, 1982).

*Primary Examiner*—Sam Silverberg
*Attorney, Agent, or Firm*—Hamilton, Brook, Smith & Reynolds

[57] ABSTRACT

A method for producing a uniform metal coating on a substrate consisting of (1) selecting one or more metals to be coated onto the substrate wherein the metals are soluble in a molten salt when heated, (2) preparing a bath consisting of the dissolved metal-molten salt, (3) inserting a substrate into the bath, and (4) decreasing the temperature at the substrate to a level at which the metal will precipitate out of solution onto the substrate. Multiple coatings can be made by repeating the method using the same or different metal-molten salt systems. Deposition can be enhanced by adding more salt to the bath to increase precipitation of the metal onto the substrate or by introducing additional metal into the bath by electrolysis, either by electrowinning or electrorefining. The metal coating can be patterned by localized heating of the metal coating in the metal-molten salt bath to reverse deposition or by masking areas on the substrate prior to deposition.

The method can also be used to purify the metal or compound being precipitated by controlling the composition and processing parameters of the metal-molten salt bath. Alternatively, these same parameters can be controlled to deposit metals or compounds containing desired levels of specific impurities such as in the case of doped GaAs.

21 Claims, 2 Drawing Sheets

METHOD OF FORMING A METAL COATING ON A SUBSTRATE

RELATED APPLICATION

This is a continuation in part of Ser. No. 897,116, filed Aug. 15, 1986, now abandoned.

BACKGROUND OF THE INVENTION

This invention is generally in the field of metal coatings and is in particular a method for creating a metal coating on electrically conductive as well as non-conductive substrates.

There are many instances in which it is desirable to form a metal coating on either an electrically non-conductive (i.e., dielectric) substrate or a metal substrate. A number of methods has been used with a variety of materials for this purpose. One commonly used technique is electroplating. Others include chemical vapor deposition. Deposition technologies are reviewed in detail in *Deposition Technologies for Films and Coatings* by R. F. Bunshah et al. (Noyes Publications, Park Ridge, N.J. 1982).

Electroplating is a process generally used to coat an object with a thin layer of a metal. The object to be plated is charged as the cathode and is immersed in an electrolyte bath which, among other things, contains a salt of the metal being plated. The anode can be made of the same metal or some chemically unaffected conductor. A low-voltage current is passed through the bath to electrolyze it and plate the cathode with the metal to the desired thickness. A firm bond between the metal being deposited and the article is best obtained when using two metals that tend to alloy, such as silver and copper. Disadvantages to electroplating include stringent substrate requirements, such as the type of metal that can be plated, the necessity for absolute cleanliness, and difficulties in plating uneven surfaces. Other disadvantages include the necessity of uniform temperature control and replenishment of the electrolyte bath.

Chemical vapor deposition is frequently used to produce a very thin metal coating on a substrate, particularly a substrate formed of a non-conductive material such as silicon. In this method, a volatile compound of the metal is vaporized at high temperatures (e.g. 800° to 900° C.) and subsequently decomposed in such a way that the metal itself is deposited onto the substrate. Unfortunately, at these high processing temperatures the metal coating diffuses into the underlying substrate at the same time as the deposit is forming. The result can be a diffuse rather than sharp interface between substrate and coating. Sharp interfaces improve electronic device performance in most applications.

Liquid phase epitaxy (LPE) is another method by which metal coatings can be deposited on a substrate. In this method, a first metal is dissolved into a molten bath of a second metal. A substrate, maintained at a temperature below the melting point of the first metal, is then immersed in the molten metal bath. This causes the first metal to leave solution and deposit upon the substrate. Unfortunately, it is impossible to prevent some of the second, carrier metal from becoming entrained and deposited upon the substrate with the first deposit metal. This result restricts the use of LPE in certain applications in which the specified impurity levels are too low to be met by this method.

In general, many of the methods in use are limited to conductive metal substrates or substrates that can tolerate very high temperatures. Some of these methods use health as well as safety hazards due to the need to work at high temperatures, non-atmospheric pressures and with toxic chemicals.

Thus, a need exists for a method by which pure metal coatings can be deposited upon both conductive and non-conductive substrates to provide a sharp interface. A further need exists for a method in which toxic vapor generation and handling problems are minimized.

SUMMARY OF THE INVENTION

The preferred embodiment of the present invention is a method for producing a uniform metal coating on a substrate consisting of (1) selecting a metal to be coated onto the substrate, where the metal is soluble in a molten salt when heated, (2) preparing a bath by dissolving the metal in its molten salt, (3) immersing one or more substrates into the metal-molten salt bath and (4) decreasing the temperature of the bath at the substrate so that the metal will precipitate out onto the substrate.

The rate or extent of deposition using the dissolved method can be controlled. For example, the rate of deposition is enhanced by the introduction of additional metal into the dissolved metal-molten salt bath by electrolysis, either by electrowinning or electrorefining. In a second example, precipitation of the metal is enhanced by addition of other salts to the metal-molten salt solution after the initial dissolution step.

The method can also be used to deposit alloys of two or more metals onto a substrate, to purify the metal being deposited and to deposit a metal containing a specified concentration and composition of impurities. Bath composition and temperature are varied as required to promote deposition or to alter the stoichiometry of the metals and impurities. In general, the impurities will not be deposited at the same temperature and at the same concentrations as the metal to be purified. Since metal deposited under these conditions will not entrain molten salt, only the metal and the desired impurities, if any, are deposited.

When the method is used to deposit an alloy or an element along with a dopant, such as silicon along with boron, onto the substrate, the amount of dopant to be added to the bath in addition to the metal to be deposited is determined empirically from the ratio of dopant to silicon on the substrate at a particular temperature.

Multiple coatings can be formed, with the same or different metals by repeating the method, altering the bath composition and conditions as required.

The metal coating can be patterned by heating areas of the coating, in the metal-molten salt bath, to redissolve the metal or by masking areas to prevent deposition. For example, a metal, such as copper, is deposited onto a silica substrate. Since, unlike molten metal baths, which are electronic conductors and therefore opaque to all forms of electromagnetic radiation, the molten metal-salt baths are semiconductors and as such will be transparent to some form of electromagnetic radiation, (i.e. over a limited range of frequency). Thus, patterns can be "etched" into the copper layer, for example, by means of a laser which heats the substrate in a specified manner. At points heated by the electromagnetic radiation, the metal goes back into solution in the molten salt, leaving a bare pattern on the substrate.

Other processes available using this invention include the ability to recover metals from surfaces and solutions, the ability to purify metals by selective deposition onto a substrate, the ability to selectively dope a pure metal by controlling dopant concentration in the deposition bath, and the ability to deposit alloys of selected ratios by controlling bath temperature and solute composition.

Thus, advantages of this invention include the ability to coat metals on both conductive and non-conductive substrates in a manner which provides a sharp coating/substrate interface, the ability to minimize generation of toxic vapors, the ability to provide multiple coatings on a substrate, the ability to provide a patterned coating upon a substrate, the ability to purify a metal coating on a substrate, and the ability to provide a doped metal coating upon a substrate.

DETAILED DESCRIPTION OF THE INVENTION

Figure 1:
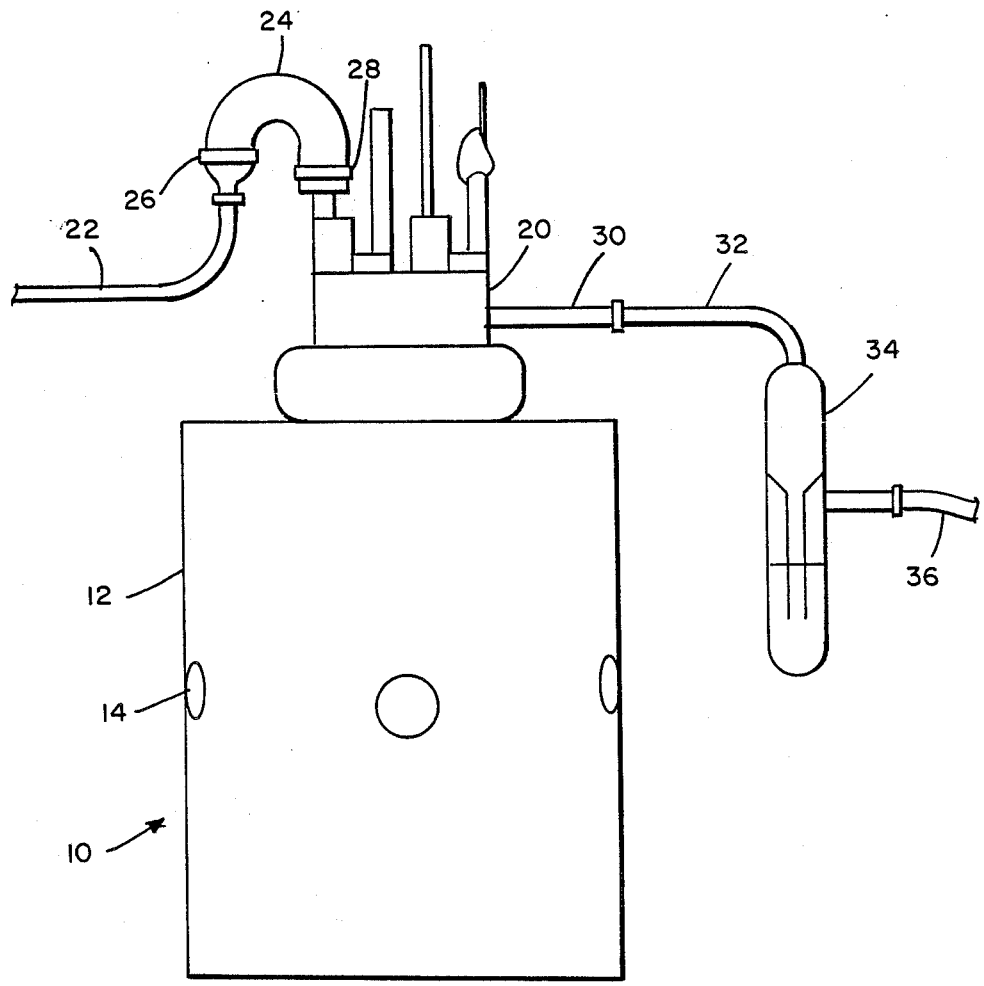
FIG. 1 is a schematic representation of the apparatus of the invention. The main features are a reaction cell contained within a furnace.

The present invention is a method for forming a metal coating on a substrate by exploiting the dependence of metal solubility in a metal-molten salt solution on temperature and solution composition. The metal to be deposited is first dissolved in the metal-molten salt solution, then precipitated out of the molten salt bath onto a substrate by lowering the temperature of the bath at the place where it contacts the substrate. This can be accomplished by cooling the substrate, by cooling the bath or by cooling both the substrate and the bath. In reverse, a metal coating can be selectively removed by immersion of the coated substrate into a metal-molten salt bath and locally heating the areas at which the metal coating is to be removed.

Metals dissolve in their molten salts, as well as in mixtures containing their salts, without the passage of any current. Therefore, any metal that is soluble in a molten salt solution as a function of temperature can be used in the present invention. Examples of metal-molten salt solutions include Ta in $TaCl_5$, Si in $K_2SiF_6$, Mg in $MgCl_2$, Cu in $CuCl_2$, Mn in $MnCl_2$/NaCl, Ag in AgCl/NaCl, Mo in $K_3MoCl_6$/KCl, Ca in $CaCl_2$, Al in $Na_3AlF_6$, Na in NaCl, Si in $K_2SiF_6$/KF, Bi in $BiCl_3$, Al in $AlCl_3$/KCl, Au in $AuCl_3$, Au in $Au(CN)_2$ and Cd in $CdCl_2$. Other divalent and trivalent metals dissolved in their salts are suitable for deposition on substrates using the principles of this invention. These include group 2 metals such as strontium and barium and group 3 metals such as yttrium, scandium, and members of the lanthanide and actinide series. The extent of dissolution and deposition are functions of the composition and temperature of the bath. Usually, the higher the concentration of the salt of the metal to be deposited and the higher the temperature of the bath, the greater the solubility of the metal.

Dissolution of the metal also occurs when current is passed through the bath during electroplating, electrowinning, or electrorefining. Such chemically dissolved metal can impart a measure of electronic conductivity to the electrolyte allowing it to pass current without electrodepositing metal. This reduces the current efficiency of electrolysis and is referred to as a departure from Faraday's Law.

The present invention is based on the observation that raising the temperature of the molten salt solution increases the solubility of the metal in the molten salt, and lowering the temperature lowers metal solubility. Since the molten salt solution at a lower temperature is supersaturated with the metal dissolved at a higher temperature, the metal tends to come out of solution. The subsequent introduction of a substrate into the supersaturated molten salt induces precipitation of the dissolved metal onto substrate. Since this involves the formation of critical size nuclei of the dissolved metal on the surface which grow to form a coating, the nature of the surface, i.e., crystal structure, roughness, temperature, etc., and the extent of supersaturation of the molten salt with respect to the dissolved metal determine the nature and extent of the coating.

The extent of dissolution can be enhanced by increasing the salt concentration of the metalmolten salt solution. The solubility of a metal in a molten salt is at a maximum at any temperature when the melt consists of a pure salt of the given metal. Thus, it is possible to enhance metal rejection from a melt by adding other salts to change the bath composition after initial metal dissolution has occurred.

FIG. 1 is a schematic representation of the apparatus used in one embodiment of the invention. In FIG. 1, the reactor, generally represented 10, comprises a heating apparatus and the reaction cell itself. The heating apparatus comprises an electrical resistance furnace 12. The furnace 12, can contain a number of small windows 14, each heated by separate controllable resistive coils.

The reaction cell 20, is contained within the furnace. Connected to the cell 20, is an inlet section of rubber tubing 22, through which an inert gas is supplied to the interior of the cell. Between the cell 20, and the inlet tubing 22, is a tubing section 24, having hose clamps 26 and 28 located adjacent to each end. The clamps serve to seal the inlet to maintain an inert atmosphere within the cell, thereby preventing contamination of salt within the cell when the apparatus is transported. Also connected to the cell 20, is an inert gas outlet 30, connected to a section of outlet tube 32 which in turn is connected to a bubbler 34 to visually measure the gas outflow rate. An exhaust tube 36, allows inert gas to exit the bubbler.

Figure 2:
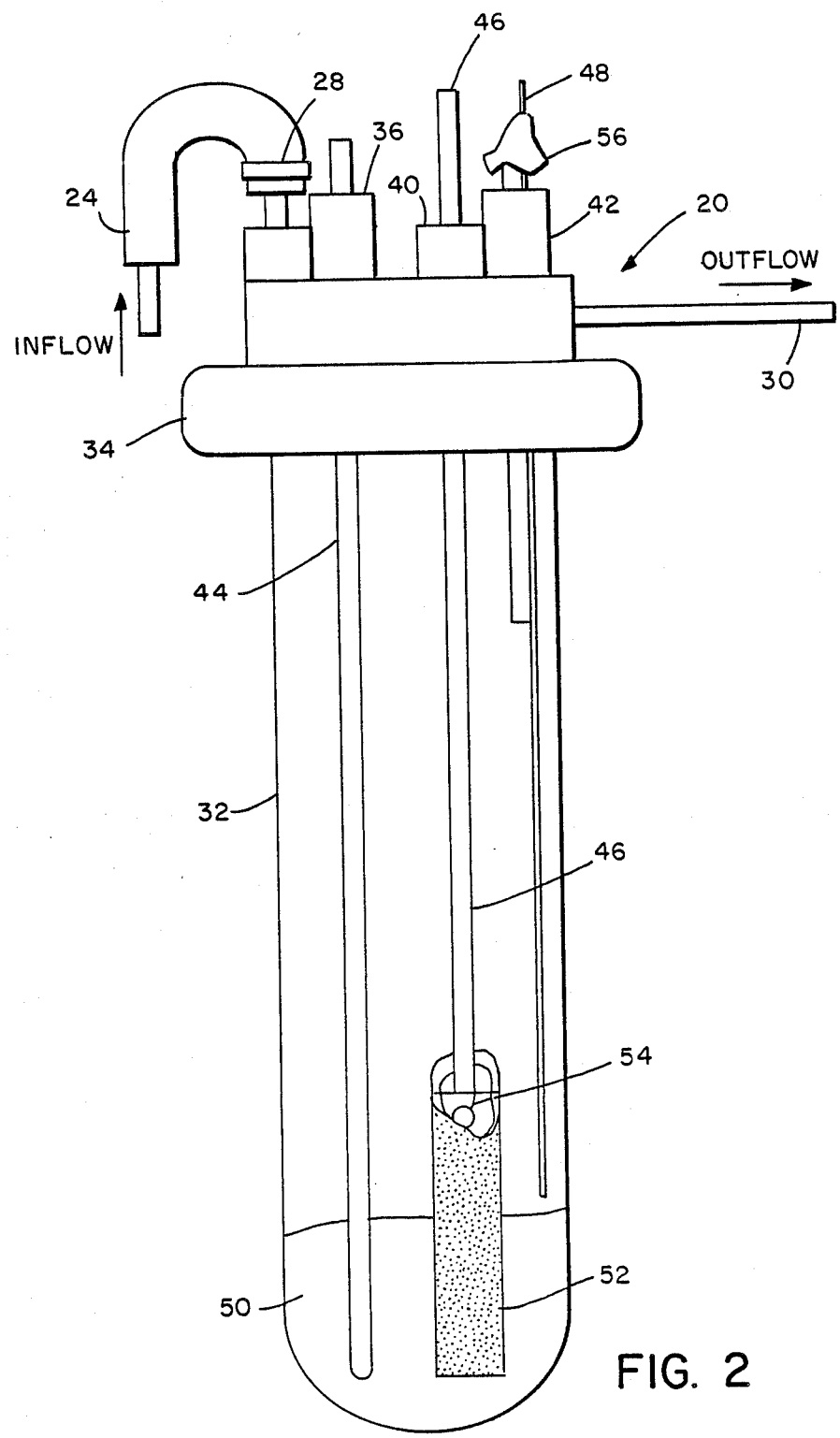
FIG. 2 is a schematic representation of the reaction cell in one embodiment of the invention. In this figure, the step of dissolving a coating metal into a molten salt prior to substrate immersion is shown.

FIG. 2 is a schematic representation of the cell 20, used in one specific embodiment of the invention. In FIG. 2, the cell 20, comprises a reaction tube 32, and a tube cap 34, having a plurality of ports 36, 38, 40 and 42.

The reaction tube 32, can be constructed of heat resistant glass. In other embodiments of the invention, the reaction tube is constructed of refractory materials such as oxides, nitrides, and borides due to the corrosivity of the metal-metal salt solution. Ports 36, 38, 40 and 42 allow a thermocouple 44, the inert gas inlet tube 22, a graphite rod 46, and a substrate 48, to communicate with the interior of the cell.

In operation, an inert gas flows from the inert gas inlet tube 22, through tubing section 24 and through the gas inlet port 38 into the reaction cell interior. The flow continues with gas exiting via the gas outlet 30. A metal salt 50 is heated to a temperature above its melting point. The temperature is monitored using the thermocouple 44. At this point of operation, the substrate 48, is suspended above the molten metal salt 50. The port 42, through which the substrate 48 passes is sealed with wax. A graphite rod 46, passes through its port 40, to the interior of the cell. A piece of nichrome wire 54, connects a strip of coating metal 52 to the graphite rod 46. The graphite rod is positioned in a manner such that the coating metal strip 52, is immersed in the metal salt 50.

After a period of time sufficient to dissolve a desired quantity of coating metal 52 into the metal salt 50 has elapsed, the graphite rod 46 is raised, thereby lifting the coating metal out of the molten salt 50. At this point, the substrate 48, is lowered into the supersaturated salt bath 50. The temperature is then lowered, using the thermocouple 44 as a monitor, to a point at which the metal salt 50 is maintained in a molten state with dissolved coating metal supersaturating the salt 50. The supersaturation of the dissolved coating metal causes it to precipitate onto the substrate surface, thereby producing a coated substrate. After a time sufficient to coat the substrate 48, to a desired level, it is removed from the molten salt 50. The salt is then allowed to cool to ambient temperature. Analysis of the substrate surface will show that a layer of coating metal 52 has been deposited upon the surface of the substrate 48.

The method of the present invention can also be used to recover metals from surfaces and solutions, to purify a metal, to alter the stoichiometric ratio of constituent elements in an alloy or compound, and to control the dopant concentration in a material such as silicon by exploiting the differential solubilities of various elements in molten salts.

Using the method of this invention it is possible to recover metals previously deposited on a substrate. For example, gold can be removed from integrated circuit chips using the method outlined herein. In this case, the gold-containing chip is immersed in a gold bearing molten salt such as $AuCl_3$ or $Au(CN)_2$. The salt is maintained at a temperature such that the gold contained on the chip surface dissolves into the molten salt. The chip is removed and a removal substrate is then immersed in the Au-gold salt bath. As the bath temperature is lowered, the dissolved gold precipitates onto the removal substrate. The deposited gold can then be separated from the removal substrate surface if desired, or alternatively, may be left upon the substrate surface if deposition on this surface is the desired result.

Similarly, a metal can be dissolved from a surface into a molten metal salt bath and recovered without a recovery substrate. In this method, the substrate containing the metal to be recovered is immersed into a molten bath of a metal salt of the metal to be recovered. As outlined previously, the metal is allowed to dissolve into the molten metal salt bath. The metal solubility of the bath can then be lowered by reducing the bath temperature or by adding an additional salt to the bath. This results in a molten salt bath supersaturated with metal. If a seed material, in the form of a powder for example, is then added to the molten bath, the supersaturating metal will precipitate out of the bath, thereby allowing its recovery. Alternatively, even in the absence of a seed material the dissolved metal can be forced to precipitate if the degree of supersaturation is sufficient.

To purify a metal, the metal is dissolved in the molten salt. At any temperature there is a solubility limit. Conversely, for any concentration of dissolved metal there is a temperature below which the metal precipitates out of solution. Through choice of elemental concentrations and temperatures it is possible to precipitate the impurities out before the precipitation of the metal or to maintain them in solution while the metal is precipitated. A series of discrete precipitations can be performed or a thermal gradient established in the metal-molten salt bath with a substrate introduced at the place where the optimum precipitation of a desired elemental constituent will occur.

In a similar fashion, an alloy or compound can be deposited at a desired composition or stoichiometric ratio, respectively, after first determining the requisite concentrations of elements dissolved in the bath for deposition of the metal alloy or compound at the specified composition or stoichiometric ratio. The kinetic processes associated with precipitation on a substrate surface make it possible to deposit alloys and compounds in stoichiometric ratios difficult to attain otherwise. For example, the higher volatility of the nonmetal constituent in gallium arsenide and in mercury cadmium telluride results in nonstoichiometry when these compounds are processed from the liquid or vapor phase. The same method applies to a doped material such as silicon. A series of tests may be conducted on the metal-molten salt bath wherein the amount of metal or dopant deposited as a function of temperature and composition is determined. It is then relatively straightforward for one skilled in the art to extrapolate backward to determine what temperature and what ratio of metal-molten salt bath components are required for the desired precipitate composition.

In another embodiment of this invention, multiple coatings of the same or different composition are applied to the substrate by repeated processing in baths of the appropriate chemistry. A variety of coatings with respect to thickness and uniformity is also possible using variations in time of deposition, temperatures, bath compositions and addition to the bath of salt or metal through electrolysis.

In another embodiment of the method, the metal coating is continuously applied to one or more substrates by setting up a metal-molten salt bath and then forming and maintaining a thermal gradient such that at one end of the gradient metal is continuously dissolved into the metal-molten salt bath and at the other end of the gradient metal is precipitated out of solution onto the substrate.

In a further embodiment of the method, a metal coating is applied to a substrate and then "patterned". The pattern is developed by heating selected portions of the metal coating on the substrate within the metal-molten salt bath. The heated metal dissolves back into the molten salt. Using electromagnetic radiation, such as that provided by a laser, to irradiate the substrate through the metal-molten salt bath, the amount of material removed can be controlled and a very fine pattern etched into the metal. As it is possible to select a combination of electromagnetic radiation source and bath through which a substrate can be heated, problems of bath opaqueness are eliminated. The metal coating can also be deposited in a pattern by masking the substrate in the areas not to be coated prior to placing the substrate in the metal-molten salt bath.

This invention is further illustrated by the following non-limiting examples demonstrating the deposition of a metal coating on both conductive and non-conductive substrates.

EXAMPLE 1

Formation of an Mn Coating on an Iron Substrate

A molten salt bath containing 50 mole percent $MnCl_2$-50 mole percent NaCl was prepared by melting the $MnCl_2$-NaCl in an iron crucible. A Mn rod was lowered into the crucible at 810° C. The temperature was increased to 900° C. After three hours, the Mn rod was pulled out of the salt. Approximately 20 grams NaCl was added to the melt to decrease Mn solubility and promote precipitation of the Mn from the molten salt solution. The temperature was lowered to 800° C. and maintained at that temperature for two hours. The crucible was then cooled to room temperature.

An Mn coating was formed uniformly on the surface of the crucible, as determined by energy dispersive analysis by X-ray (EDAX).

EXAMPLE 2

Formation of an Mn Coating on a Copper Wire Substrate

A molten salt bath containing 20 mole percent $MnCl_2$-80 mole percent NaCl was prepared in a fused quartz crucible. As in Example 1, an Mn rod was lowered into the crucible, the crucible heated to 810° C., the temperature raised to 870° C. for 20 minutes, and the rod removed. A copper wire, ⅛th inch in diameter, was lowered into the salt bath. The temperature of the salt bath was lowered to 744° C. and maintained at that temperature overnight.

The copper wire was then removed from the bath and analyzed by EDAX. Analysis confirmed a uniform deposition of Mn on the wire.

EXAMPLE 3

Formation of a Manganese Coating on a Fused Quartz Crucible

A 40 mole percent $MnCl_2$-60 mole percent NaCl bath was prepared using a procedure similar to those in Examples 1 and 2. A Mn rod was lowered into the salt bath, the temperature of the bath raised to approximately 900° C., the Mn rod withdrawn after 90 minutes and the bath cooled to room temperature. As before, additional NaCl was added to the bath after withdrawal of the Mn rod to decrease the solubility of the Mn in the molten salt.

A Mn coating was uniformly formed on the surface of the fused quartz crucible, as determined by EDAX. The coating had a very low electrical resistance, as measured using a digital multimeter. The uncoated side of the crucible had infinite resistance, indicating no deposition of the metallic coating.

EXAMPLE 4

Formation of a Molybdenum Coating on a Fused Quartz Surface by Chemical Deposition in the Presence of Electro-deposition A bath containing $KCl$-$K_3MoCl_6$ (93 wt. percent KCl-7 wt. percent $K_3MoCl_6$) was heated to 800° C. in a graphite crucible. Electrodeposition of Mo was conducted in the crucible using a Mo rod as the anode and a graphite rod as the cathode. A fused quartz bell was placed around the graphite rod cathode.

Following electrolysis, a Mo coating was formed on the inside of the fused quartz bell, on the side facing the cathode. The coating was analyzed by EDAX and confirmed as elemental molybdenum.

It is important to note that the fused quartz bell itself was not polarized and could not act as an electrode. The current efficiency was well below 100%. This indicates that non-Faradaic processes were occurring during the electrolysis, and that the Mo coating was produced by chemical, not electrochemical, processes.

EXAMPLE 5

Formation of a Tantalum Coating in a Steel Rod

A molten salt bath containing 100 mole percent $TaCl_5$ was prepared by melting $TaCl_5$ in a crucible. A tantalum strip was lowered into the melt and maintained at a temperature of 233.2° C. for 150 minutes. The tantalum was then removed and the melt temperature lowered to 227.5° C. A steel rod was then lowered into the melt and the system was maintained in this manner for 120 minutes. The steel rod was then removed, and the melt was allowed to cool to room temperature.

Scanning electron microscopy was used to analyze the surface of the steel rod. The screen images showed a flaky coating which was identified by energy dispersive analysis by x-ray as elemental tantalum. The coating material (tantalum) is clearly evident upon the steel substrate.

Equivalents

Although this invention has been described with reference to its preferred embodiments, other variations and modifications will be apparent to those skilled in the art and it is intended to include all such variations and modifications within the scope of the appended claims.

We claim:

1. A method for producing a metal coating on a substrate comprising:
   (a) selecting a first metal to be coated onto the substrate wherein said metal is soluble in a molten salt when heated to a first temperature, said metal and molten salt being selected from the group consisting of Mn-$MnCl_2$/NaCl, Ag-AgCl/NaCl, Mo-$K_3MoCl_6$/KCl, Mg-$MgCl_2$, Ca-$CaCl_2$, Al-$Na_3AlF_6$, Na-NaCl, Si-$K_2SiF_6$/KF, Ta-$TaCl_5$, Cd-$CdCl_2$, Cu-$CuCl_2$, Sr-$SrCl_2$, Ba-$BaCl_2$, Y-$YF_3$, Sc-$ScF_3$, Bi-$BiCl_3$, Al-$AlCl_3$/KCl, Au-$AuCl_3$, Au-$Au(CN)_2$, lanthanide series metals-lanthanide salts, and actinide series metals-actinide salts,
   (b) heating a bath of said metal and molten salt to the first temperature to dissolve said metal,
   (c) placing the substrate to be coated in the bath, and
   (d) decreasing the temperature of the bath at the substrate to a second temperature, wherein the dissolved metal precipitates out of the molten salt onto the substrate at the second temperature.

2. The method of claim 1 further comprising adding impurities to the metal-molten salt bath, wherein said impurities precipitate out of the solution with the metal.

3. The method of claim 1 further comprising enhancing precipitation of the dissolved metal out of the molten salt onto the substrate by adding more of said first metal to the bath.

4. The method of claim 3 wherein additional metal is added to the bath by passage of an electric current through said metal in the bath.

5. The method of claim 1 further comprising altering the salt composition after heating the first metal-molten salt solution to the first temperature.

6. The method of claim 5 further comprising cooling said first metal-molten salt solution to the second temperature.

7. The method of claim 6 further comprising altering the salt composition to favor exsolution of said first dissolved metal.

8. The method of claim 1 further comprising selecting a second metal to be coated onto the substrate, wherein said first and second metals are soluble in a molten salt mixture.

9. A method for producing a multilayered metal coating on a substrate comprising:
   (a) selecting a first metal to be coated onto the substrate wherein said first metal is soluble in a molten salt when heated to a first temperature,
   (b) heating a bath of said first metal and molten salt to the first temperature to dissolve said first metal,
   (c) placing the substrate to be coated in the bath,
   (d) decreasing the temperature of the bath at the substrate to a second temperature, wherein the dissolved first metal precipitates out of the molten salt onto the substrate at the second temperature,
   (e) selecting a second metal to be coated onto the substrate wherein said second metal is soluble in the molten salt when heated to a third temperature,
   (f) heating a bath of said second metal and molten salt to the third temperature to dissolve said second metal,
   (g) placing the substrate to be coated in the bath, and,
   (h) decreasing the temperature of the bath at the substrate to a fourth temperature, wherein the dissolved second metal precipitates out of the molten salt onto the substrate at the fourth temperature, thereby providing a substrate having a multilayered metal coating wherein said first and second metal and molten salt being selected from the group consisting of $Mn-MnCl_2NaCl$, $Ag-AgCl/NaCl$, $Mo-K_3MoCl_6/KCL$, $Mg-MgCl_2$, $Ca-CaCl_2$, $Al-Na_3AlF_6$, $Na-NaCl$, $Si-K_2SiF_6/KF$, $Ta-TaCl_5$, $Cd-CdCl_2$, $Cu-CuCl_2$, $Sr-SrCl_2$ $Ba-BaCl_2$, $Y-YF_3$, $Sc-ScF_3$, $Bi-BiCl_3$, $Al-Alcl_3/KCl$, $Au-AuCl_3$, $Au-Au(CN)_2$, lanthanide series metals-lantahanide salts, and actinide series metals-actinide salts.

10. The method of claim 9 further comprising changing the bath chemistries and processing parameters to create a multilayer coating of discrete compositions.

11. The method of claim 1 further comprising removing portions of said metal coating by heating said substrate in the metal-molten salt bath at the sites where the metal coating is to be removed.

12. The method of claim 11 further wherein said substrate is heated using electromagnetic radiation to selectively redissolve portions of said metal coating.

13. The method of claim 12 wherein the electromagnetic radiation is supplied by a laser.

14. The method of claim 1 further comprising masking areas of the substrate prior to precipitation of the metal onto the substrate.

15. The method of claim 1 for purifying a metal wherein the temperature of the bath is decreased to a temperature at which the pure metal precipitates out of the molten salt solution and the impurities remain in solution.

16. The method of claim 1 for purifying a metal wherein the temperature of the bath is decreased to a temperature at which pure metal is in solution and the impurities precipitate out of the molten salt solution.

17. The method of claim 1 further comprising selecting a second metal, wherein said first and second metals are soluble in the molten salt when heated to a first temperature,
   adding said second metal to the molten salt and
   decreasing the temperature of the molten-salt bath to precipitate said first and second metals.

18. The method of claim 17 further comprising adding said first metal to the molten salt bath at a ratio of said first metal to said second metal so said first and second metals co-precipitate.

19. The method of claim 1 further comprising maintaining a thermal gradient in the metal-molten salt bath.

20. The method of claim 19 further comprising continuously replenishing the metal-molten salt bath with dissolved metal.

21. The method of claim 20 further comprising continuously precipitating said metal onto substrate positioned appropriately within the thermal gradient.

* * * * *